(12) United States Patent
Fersan (10) Patent No.: US 9,847,588 B2
(45) Date of Patent: Dec. 19, 2017

(54) CONNECTING SYSTEM FOR SUPERCONDUCTING SYSTEMS

(71) Applicant: Varian Semiconductor Equipment Associates, Inc., Gloucester, MA (US)

(72) Inventor: Semaan Y. Fersan, South Hamilton, MA (US)

(73) Assignee: Varian Semiconductor Equipment Associates, Inc., Gloucester, MA (US)

(*) Notice: Subject to any disclaimer, the term of this patent is extended or adjusted under 35 U.S.C. 154(b) by 604 days.

(21) Appl. No.: 14/715,669

(22) Filed: May 19, 2015

(65) Prior Publication Data

US 2016/0344113 A1    Nov. 24, 2016

(51) Int. Cl.
| | |
|---|---|
| *H01R 4/68* | (2006.01) |
| *H01R 4/28* | (2006.01) |
| *H01R 13/22* | (2006.01) |
| *H01R 9/24* | (2006.01) |
| *H02H 9/02* | (2006.01) |

(52) U.S. Cl.
CPC .............. *H01R 4/68* (2013.01); *H01R 4/28* (2013.01); *H01R 9/2408* (2013.01); *H01R 13/22* (2013.01); *H02H 9/023* (2013.01)

(58) Field of Classification Search
CPC . H01R 4/68; H01R 4/28; H01R 13/22; H01R 9/2408; H02H 9/023
USPC ........................................................ 361/19
See application file for complete search history.

(56) References Cited

U.S. PATENT DOCUMENTS

| | | | |
|---|---|---|---|
| 5,346,412 A | * | 9/1994 | Fedder ............... H01R 13/6272 439/681 |
| 2010/0273657 A1 | | 10/2010 | Martchevskii |
| 2012/0214673 A1 | | 8/2012 | Usoskin |
| 2012/0275067 A1 | | 11/2012 | Tekletsadik |
| 2013/0130913 A1 | | 5/2013 | Citver et al. |

FOREIGN PATENT DOCUMENTS

WO    2009/010715 A1    1/2009

OTHER PUBLICATIONS

International Search Report and Written Opinion dated Jul. 26, 2016 in corresponding PCT application No. PCT/US2016/030578.

* cited by examiner

*Primary Examiner* — Zeev V Kitov
(74) *Attorney, Agent, or Firm* — Nields, Lemack & Frame, LLC (57) ABSTRACT

A system for connecting superconducting tapes in a superconducting fault current limiter (SCFCL) system is disclosed. The novel connector system allows two superconducting tapes to be installed in a single opening in a connector stack. This reduced the height of the connector stack by nearly 50%, making the SCFCL system more efficient and smaller in volume. In one embodiment, each connector has a recessed portion on both the top and bottom surfaces, such that when stacked on another connector, the recessed portions align, forming a larger opening. In another embodiment, the connector has a single recessed portion that can accommodate two superconducting tapes. The superconducting tapes may be disposed in a protective sleeve.

20 Claims, 6 Drawing Sheets

CONNECTING SYSTEM FOR SUPERCONDUCTING SYSTEMS

FIELD

Embodiments of the present disclosure relate to superconducting systems, and more particularly, for reducing space used for interconnects within a superconducting system.

BACKGROUND

In electric power transmission and distribution networks, fault current conditions may occur. A fault current condition is an abrupt surge in the current flowing through the network caused by a fault or a short circuit in the network. Causes of a fault may include lightning striking the network, and downing and grounding of transmission power lines due to severe weather or falling trees. When a fault occurs, a large load appears instantaneously. In response, the network delivers a large amount of current (i.e., overcurrent) to this load or, in the case, the fault. This surge or fault current condition is undesirable and may damage the network or equipment connected to the network. In particular, the network and the equipment connected thereto may burn or, in some cases, explode.

One system used to limit a fault current and to protect power equipment from damage caused by a fault current is a superconducting fault current limiter (SCFCL) system. Generally, an SCFCL system comprises a superconducting circuit that exhibits almost zero resistivity below a critical temperature level $T_C$, a critical magnetic field level $H_C$, and a critical current level $I_C$. If at least one of these critical level conditions is exceeded, the circuit quenches and exhibits resistivity.

During normal operation, the superconducting circuit of the SCFCL system is maintained below the critical level conditions of $T_C$, $H_C$, and $I_C$. During a fault, one or more of the aforementioned critical level conditions is exceeded. Instantaneously, the superconducting circuit in the SCFCL system is quenched and resistance surges, which in turn limits transmission of the fault current and protects the network and associated equipment from the overload. Following some time delay and after the fault current is cleared, the superconducting circuit returns to normal operation wherein none of the critical level conditions are exceeded and current is again transmitted through the network and the SCFCL system.

Conductors, typically in the form of a flat wire or conductive tape, are typically used to transmit electrical energy or signals within the SCFCL system. For example, within the SCFCL system, a superconducting circuit may be disposed between two external terminals. This superconducting circuit carries current between these two terminals. During normal operation, this superconducting circuit may allow hundreds of amps to pass. In the event of a fault, almost no current passes, and a large voltage difference exists between the two terminals. The voltage difference may determine the length of superconducting tape that is disposed within the SCFCL system. The operational current may determine how many superconducting tapes are used in parallel to deliver the desired current. Therefore, often a plurality of conductive tapes is used to transmit the electrical energy. These superconducting tapes are assembled within a device that may include a plurality of connectors, each of which holds a corresponding conductive tape. These connectors may be stacked on top of one another to form a stack.

Conductive tapes may expand due to changes in temperature, and also may vibrate due to magnetic fields generated by current flowing through the conductive tapes. Therefore, these connectors typically have a minimal spacing between each other to minimize the likelihood of the conductive tapes touching each other, during normal or fault conditions. Such contact, even if minimal, may result in electrical and/or mechanical interference, which may lead to decreased longevity and reliability of the conductive tapes.

The number of connectors and the minimal spacing between connectors are factors in determining the overall size of the SCFCL system. Therefore, it would be beneficial to minimize the connecting system employed in a SCFCL system. A smaller form factor connecting system may reduce the overall size of the SCFCL system for a given operating specification. Additionally, within a given volume, higher voltage/current operation would be possible.

SUMMARY

A system for connecting superconducting tapes in a superconducting fault current limiter (SCFCL) system is disclosed. The novel connector system allows two superconducting tapes to be installed in a single opening in a connector stack. This reduced the height of the connector stack by nearly 50%, making the SCFCL system more efficient and smaller in volume. In one embodiment, each connector has a recessed portion on both the top and bottom surfaces, such that when stacked on another connector, the recessed portions align, forming a larger opening. In another embodiment, the connector has a single recessed portion that can accommodate two superconducting tapes. The superconducting tapes may be disposed in a protective sleeve.

According to one aspect, a superconducting fault current limiter (SCFCL) system is disclosed. The SFFCL system comprises a tank; coolant contained in the tank; a connector stack immersed in the coolant, the connector stack comprising a plurality of connectors disposed one on top of another, and having one or more openings, each opening adapted to hold two superconducting tapes; and two superconducting tapes, in a paired configuration, disposed in a respective one of the one or more openings. In certain embodiments, each connector in the connector stack has a first surface and a second surface, opposite the first surface, such that the first surface of a first connector in the connector stack is disposed on the second surface of a second connector, and wherein each first surface comprises a first recessed portion and each second surface comprises a second recessed portion, wherein the first recessed portion of the first connector is aligned with the second recessed portion of the second connector, and together form one of the one or more openings. In certain embodiments, each connector in the connector stack has a first surface and a second surface, opposite the first surface, such that the first surface of a first connector in the connector stack is disposed on the second surface of a second connector, and wherein each first surface comprises a deep recessed portion, which forms one of the one or more openings.

According to another aspect, a connecting system for use with superconducting tape is disclosed. The connecting system comprises a connector stack immersed in a coolant, the connector stack comprising a plurality of connectors disposed one on top of another, and having one or more openings, each adapted to hold two superconducting tapes; and two superconducting tapes, in a paired configuration, disposed in a respective one of the one or more openings. In certain embodiments, at least one of the two superconducting tapes is disposed in a protective sleeve.

According to a third aspect, superconducting fault current limiter (SCFCL) system is disclosed. The SCFCL system comprises a tank; coolant contained in the tank; and a superconducting array immersed in the coolant, the superconducting array comprising a substrate having a first end and a second end; a first connector stack disposed at the first end, comprising a plurality of connectors disposed one on top of another, and having one or more first openings, each first opening adapted to hold two superconducting tapes; a second connector stack disposed at the second end, comprising a plurality of connectors disposed one on top of another, and having one or more second openings, each second opening adapted to hold two superconducting tapes; and two superconducting tapes, in a paired configuration, each having a first end and a second end, wherein the first end of the two superconducting tapes is disposed in one of the one or more first openings and the second end of the two superconducting tapes is disposed in one of the one or more second openings. In certain embodiments, a first side of each of the two superconducting tapes is superconducting and a second side, opposite the first side, is non-superconducting, and the second side of the two superconducting tapes are adjacent to one another.

BRIEF DESCRIPTION OF THE FIGURES

For a better understanding of the present disclosure, reference is made to the accompanying drawings, which are incorporated herein by reference and in which.

DETAILED DESCRIPTION

A superconducting fault current limiter (SCFCL) system may comprise an enclosure electrically decoupled from ground, such that the enclosure is electrically isolated from a ground potential. In other embodiments, the enclosure may be grounded. The SCFCL system may also have first and second terminals, electrically connected to one or more current carrying lines, and a first superconducting circuit contained within the enclosure, wherein the first superconducting circuit may be electrically connected to the first and second terminals.

Figure 1:
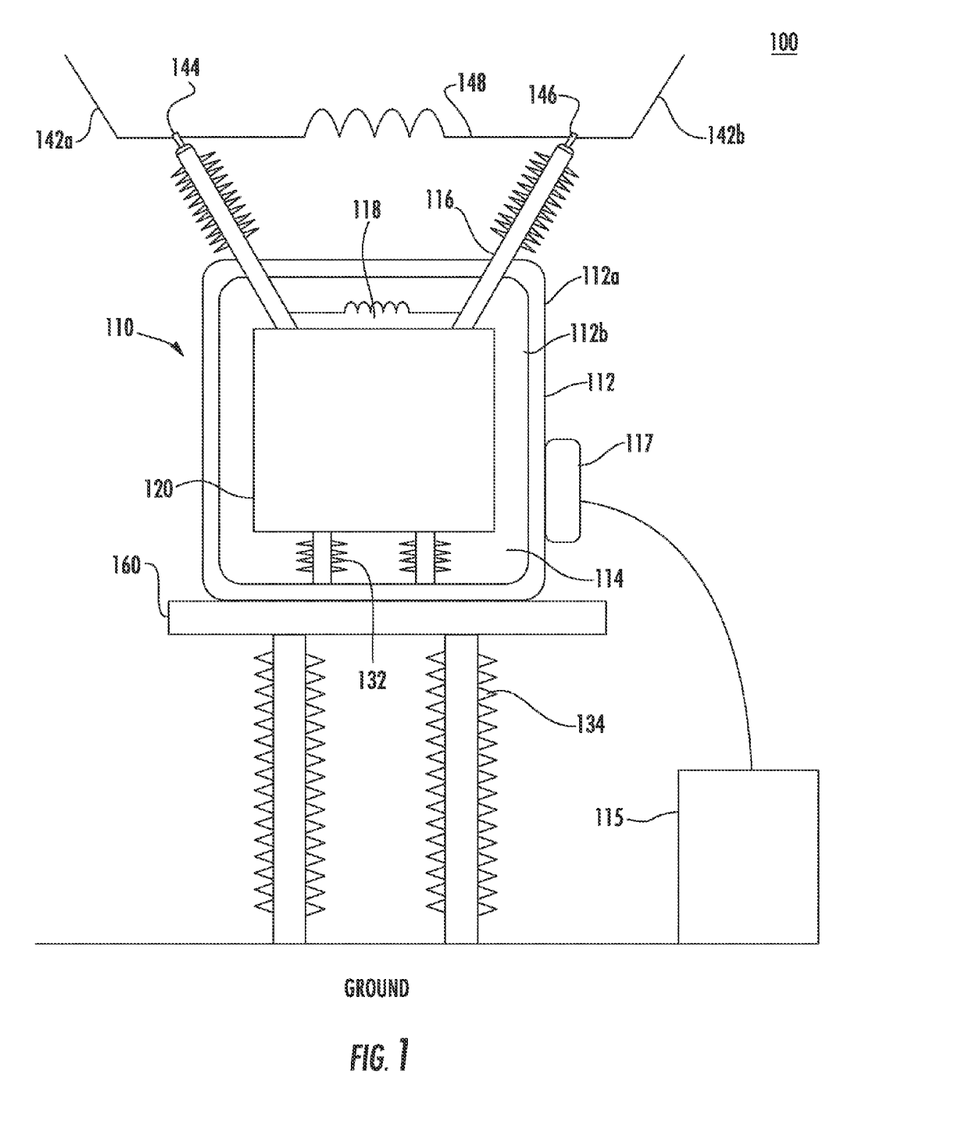
FIG. 1 is a superconducting fault current limiter (SCFCL) system using the connecting system, according to an embodiment of the present disclosure.

Referring to FIG. 1, there is shown an exemplary system using the connecting system, according to an embodiment of the present disclosure. In the present embodiment, a superconducting fault current limiter (SCFCL) system 100 using the connecting system is shown. Although the present embodiment focuses on SCFCL system 100, it should be appreciated that the present disclosure is not limited thereto. Those skilled in the art should recognize that the connecting system may be used with other electrical systems comprising connections regarding a plurality of conductive tapes or wires.

The SCFCL system 100 of the present embodiment may comprise one or more phase modules 110. For the purposes of clarity and simplicity, the description of SCFCL system 100 will be limited to one single phase module 110 although various other embodiments using more than one phase module may be used.

The phase module 110 of SCFCL system 100 may comprise an enclosure or tank 112 defining a chamber therein. In one embodiment, the enclosure or tank 112 may be thermally insulated. In other embodiments, the enclosure or tank 112 may be electrically insulated. The enclosure or tank 112 may be made from a variety of materials, such as fiberglass or other dielectric materials. In other embodiments, the enclosure or tank 112 may be made of an electrically conductive material, such as metal (e.g., stainless steel, copper, aluminum, or other metal). The enclosure or tank 112 may also comprise an outer layer 112a and an inner layer 112b. An insulating medium (e.g., a thermal and/or electrically insulating medium) may be interposed between the outer layer 112a and the inner layer 112b.

In some embodiments, the enclosure or tank 112 may or may not be connected to earth ground. In another embodiment, the enclosure or tank 112 may be electrically coupled to transmission/distribution network current lines 142a and 142b and maintained at line voltage.

Within the enclosure or tank 112, there may be one or more fault current limiting units 120, which, for the purpose of clarity and simplicity, are shown as a block. The phase module 110 may also comprise one or more electrical bushings 116. Distal ends of the electrical bushings 116 may be coupled to transmission/distribution network current lines 142a and 142b via terminals 144 and 146, respectively. This configuration may allow the phase module 110 to be coupled to a transmission/distribution network (not shown). The transmission/distribution network current lines 142a and 142b may be transmission lines to transmit power from one location to another (e.g., current source to current end users), or power or current distribution lines.

The electrical bushings 116 may comprise conductors having inner conductive material that connects the terminals 144 and 146 to the fault current limiting unit 120. Meanwhile, the outer layer 112a may be used to insulate the enclosure or tank 112 from an inner conductive material, allowing the enclosure or tank 112 and the terminals 144 and 146 to be at different electrical potentials. In some embodiments, the phase module 110 may comprise an internal shunt reactor 118 or an external shunt reactor 148, or both, to connect the conductive material contained in the electrical bushings 116.

Several insulated supports may be used to insulate various voltages from one another. For example, insulated supports 132 within the enclosure or tank 112 may be used to isolate the voltage of the phase module 110 from the enclosure or tank 112. Additional supports 134 may be used to isolate a platform 160 and the components resting thereon from ground.

The temperature of the fault current limiting unit 120 may be maintained at a desired temperature range using coolant 114 in the enclosure or tank 112. In some embodiments, the fault current limiting unit 120 may be cooled and maintained at a low temperature range, for example, at or around ~77K.

The coolant 114 may include liquid nitrogen or other cryogenic fluid or gas. The coolant 114 itself may be cooled using an electrical cooling system, which may further comprise a cryogenic compressor 117 and a transformer 115. Other types of cooling systems may also be used to keep the coolant 114 at low temperatures.

Flat conductive tape, such as a superconducting tape, may be used to transmit electrical energy or signals within the fault current limiting unit 120. This superconducting tape carries current between these terminals 144 and 146. During normal operation, this superconducting tape may allow hundreds of amps to pass. In the event of a fault, almost no current passes, and a large voltage difference exists between the terminals 144 and 146. The voltage difference may determine the length of superconducting tape that is disposed within the fault current limiting unit 120. The operational current may determine how many superconducting tapes are used in parallel to deliver the desired current. Therefore, often a plurality of conductive tapes is used to transmit the electrical energy.

Figure 2:
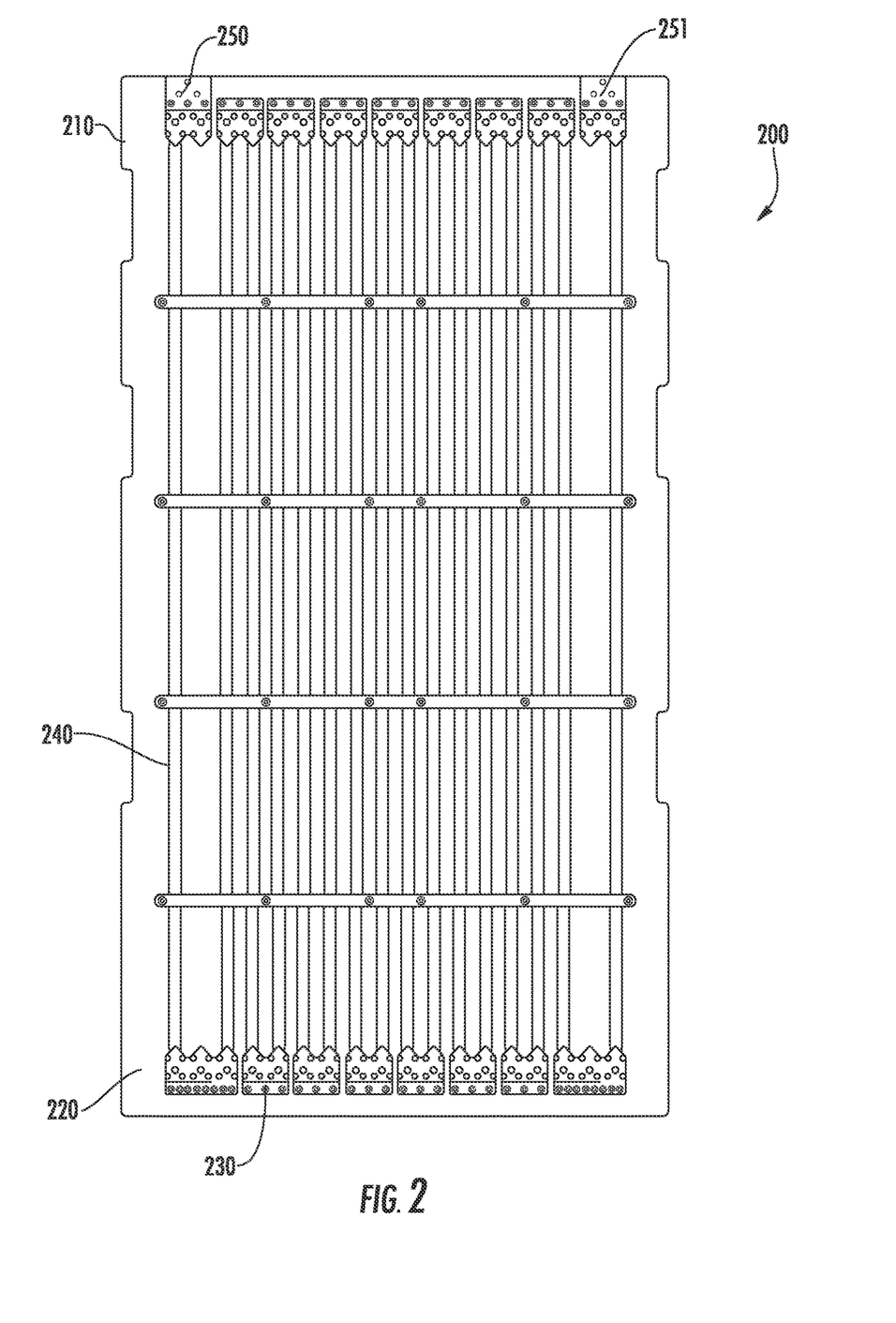
FIG. 2 is a superconducting array disposed in the SCFCL system according to one embodiment.

FIG. 2 shows a superconducting array 200 contained within the SCFCL system 100, which may include the connecting system according to one embodiment. The superconducting array 200 may be a substrate 205 having two spaced apart ends; first end 210 and second end 220. Disposed on the first end 210 may be a first end port 250 and a second end port 251. The end ports may be used to connect to the terminals 144 and 146 (see FIG. 1). Each end may be used to hold a plurality of connectors 230. Further, each connector 230 may have two or more ports, including first port 235 and second port 236 (see FIG. 3A). One or more superconducting tapes 240 may extend between a port on a connector 230 on the first end 210 and a port on a connector 230 on the second end 220. The connectors 230 on the first end 210 may be offset from the connectors 230 on the second end 220. For example, superconducting tapes 240 extending from the two ports of a connector 230 on the first end 210 may connect to ports on two different connectors 230 on the second end 220. In this way, the superconducting tape 240 may be connected in a serpentine pattern between the first end port 250 and the second end port 251.

In certain embodiments, multiple superconducting arrays 200 may be connected in series. In other embodiments, multiple superconducting arrays 200 may be connected in parallel.

Each connector 230 may be made of a conductive material, such as copper. To utilize multiple superconducting tapes in parallel, the connectors 230 may be stacked on top of one another. FIG. 2 shows the superconducting array 200 having a width and a length. The stacking of connectors 230 also causes the superconducting array 200 to have a height. Depending on the number of parallel superconducting tapes that are used, that height may be variable.

Figure 3A:
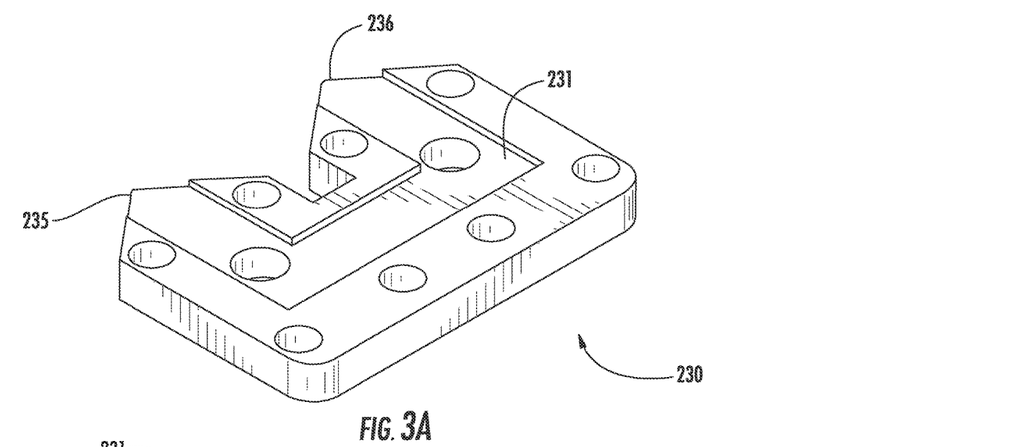
FIGS. 3A-3B are views of a connector used in the connecting system according to one embodiment.
Figure 3B:
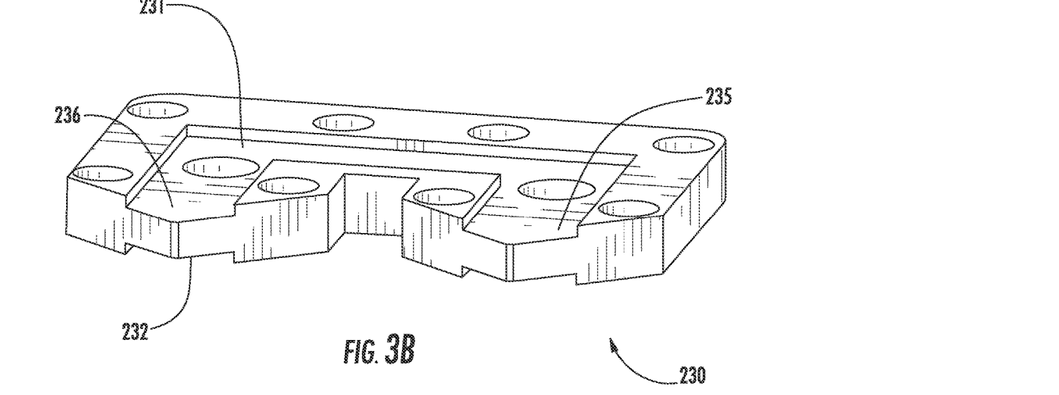

FIGS. 3A-3B show two views of the connector 230 according to one embodiment. While FIGS. 3A-3B shows a specific shape, it is understood that the connector 230 may have any suitable shape and that the shape and thickness of the connector 230 is not limited by this disclosure. As described above, the connector 230 may have two ports; a first port 235, and a second port 236. Of course, in certain embodiments, the connector 230 may have a different number of ports. On the first, or top, surface, the first port 235 and the second port 236 of the connector 230 may each include a first slotted portion 231 into which a superconducting tape 240 is inserted or disposed. In this particular embodiment, the first slotted portion 231 is a recessed area on the first surface of the connector 230, which extends between the two ports. In other embodiments, each of the ports may have a separate first slotted portion 231, which do not connect to one another.

Unlike traditional connectors, the connector 230 may also include a second slotted portion 232 disposed on the second, or bottom, surface of the connector 230, as shown in FIG. 3B. This second slotted portion 232 may be the same shape as the first slotted portion 231. The second slotted portion 232 may also be aligned with the first slotted portion 231 such that when two connectors 230 are stacked on top of each other, the second slotted portion 232 of the upper connector is aligned with the first slotted portion 231 of the lower connector.

Figure 4:
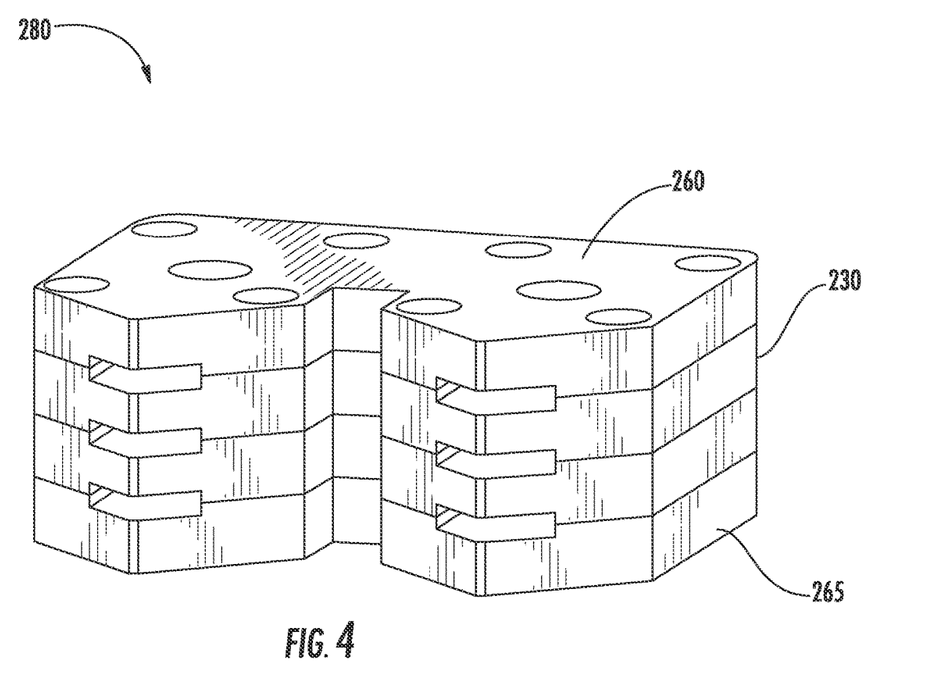
FIG. 4 is a connector stack using the connector of FIGS. 3A-3B.

A stack 280 including a plurality of connectors 230 disposed on top of each other is shown in FIG. 4. The connecting system may also utilize specialized top connectors 260 and bottom connectors 265 for use in the stack 280. As the name suggests, a bottom connector 265 is the connector that is disposed at the bottom of the stack 280. This bottom connector 265 may not have a second slotted portion on its bottom surface, since that surface is in contact with the substrate 205. The top connector 260 is used on the top of the stack 280 and may not have a first slotted portion on its top surface. In certain embodiments, specialized top connectors 260 and bottom connectors 265 are used, each of which has only one slotted portion. In other embodiments, connectors 230 with a first slotted portion 231 and a second slotted portion 232 may be used as the top connector 260 and the bottom connector 265. In embodiments where specialized top connectors 260 and bottom connectors 265 are used, these two connectors may be the same component, simply flipped over, depending on its position in the stack 280.

Each slotted portion in a connector 230 may be adapted to hold exactly one superconducting tape 240. Therefore, the number of superconducting tapes 240 which may be in parallel is determined by the number of connectors in the stack 280. Specifically, the top connector 260 and each bottom connector 265 each have one available slotted portion and therefore hold one superconducting tape 240. Each connector 230 disposed between the top connector 260 and the bottom connector 265 holds two superconducting tapes 240; one in the first slotted portion 231 and one in the second slotted portion 232. Thus, if N superconducting tapes 240 are to be used in parallel, the stack 280 would include a total of (N/2)+1 connectors, which includes a top connector 260, a bottom connector 265 and (N/2)−1 connectors 230.

In comparison, traditional connectors have only a single slotted portion on one surface. Using a stack of these traditional connectors, a total of N+1 connectors, which includes a top connector, a bottom connector and N−1 connectors would be used. As the number (N) of superconducting tapes 240 increases, the reduction in the number of connectors 230 used, and thus the overall height of the stack 280, becomes significant. For example, to support 8 parallel superconducting tapes 240, a stack of 9 traditional connectors may be used. In contrast, using this novel connecting system, a stack 280 of only 5 connectors is employed! This represents a space savings of nearly 50% over traditional connectors.

As described above, a first slotted portion 231 of a first connector and a second slotted portion 232 of a second connector may be aligned when the connectors 230 are arranged in a stack 280. In other words, when inserted into these slotted portions, two superconducting tapes 240 are disposed one on top of the other in a paired configuration. In certain embodiments, it may be beneficial if these two superconducting tapes 240 are kept separate from one another. This may reduce the likelihood of the superconducting tapes 240 being damaged during a fault condition. In one embodiment, shown in FIG. 5A, each superconducting tape 240 in the paired configuration is placed in a protective sleeve 290. The protective sleeve 290 separates the superconducting tapes 240 to prevent shorting, particularly during a fault condition. Additionally, the protective sleeve 290 is designed to allow coolant to pass through, allowing the superconducting tapes 240 to be cooled by the coolant. Thus, the protective sleeve 290 may be a porous material. In certain embodiments, the protective sleeve 290 may be silk, cotton, and wool. In other embodiments, the protective sleeve 290 may be a porous dielectric material, such as polytetrafluoroethylene (PTFE) or polyethylene terephthalate (PET).

Figure 5A:
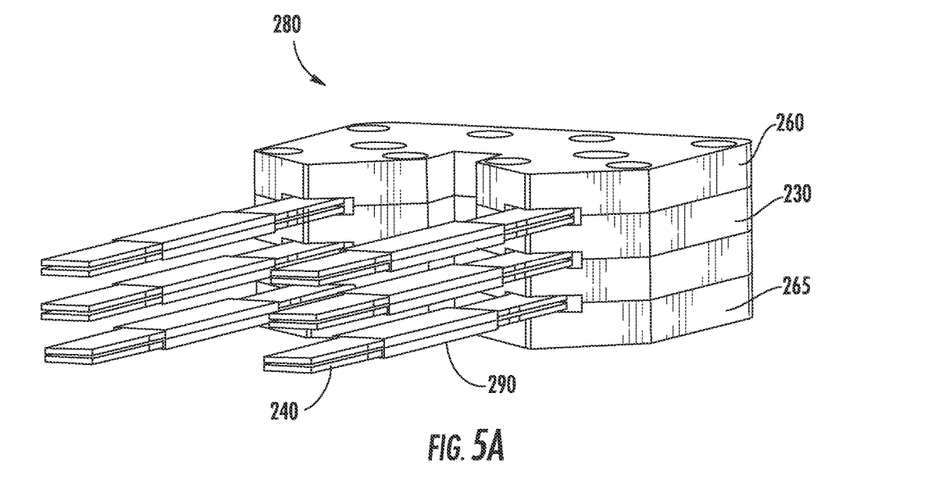
FIG. 5A is a connector stack using the connector of FIGS. 3A-3B with superconducting tapes according to a first embodiment.

The protective sleeve 290 may be used to cover the superconducting tape 240 along its length, such that only the ends of the superconducting tape 240, where the end is disposed in the slotted portions of the connectors 230, are exposed.

Figure 5B:
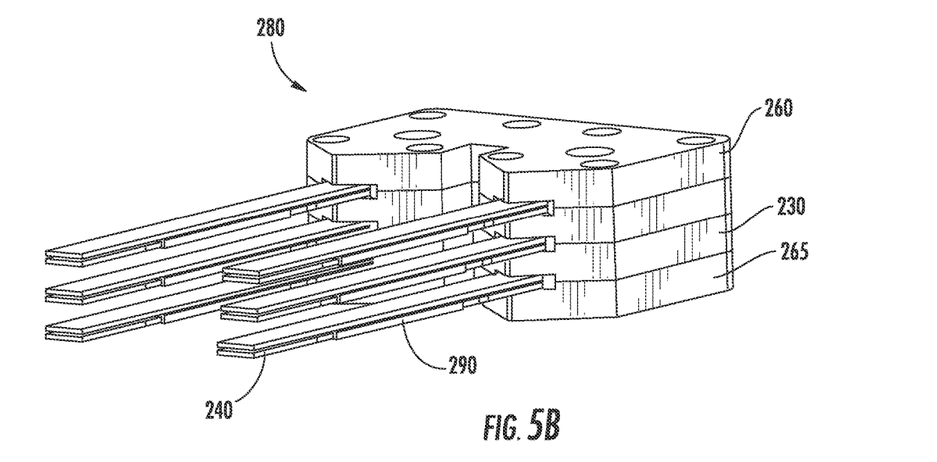
FIG. 5B is a connector stack using the connector of FIGS. 3A-3B with superconducting tapes according to a second embodiment.

FIG. 5B shows a second embodiment. In this embodiment, only one of the two superconducting tapes 240 in a paired configuration is placed in a protective sleeve 290. For example, the bottom superconducting tape 240 of each paired configuration may be disposed in the protective sleeve 290, while the top superconducting tape 240 in the paired configuration is left exposed. If this is repeated for all paired configurations in the stack 280, no two exposed superconducting tapes 240 will be adjacent to one another.

Further, the superconducting tape 240 may contain multiple layers, one or more of which may be a high temperature superconductor (HTS) layer. Examples of an HTS in the layer may include copper oxide based superconductor such as YBCO or other rare earth BCO (ReBCO), BSCCO, TBCCO, or $HgBa_2Ca_2Cu_3O_x$, or other iron (Fe) based HTS. Above or below the HTS layer, there may be one or more layers formed from a variety of conductive materials. These conductive materials may include copper, aluminum, silver, steel, or other conductive material or composite. Thus, the superconducting tape 240 typically has a first side, which comprises a layer of superconducting material, and a second side, opposite the first side, which is non-superconducting. Superconducting tapes 240 in a paired configuration may be disposed such that the non-superconducting second sides of the two tapes 240 are adjacent to one another.

Figure 6:
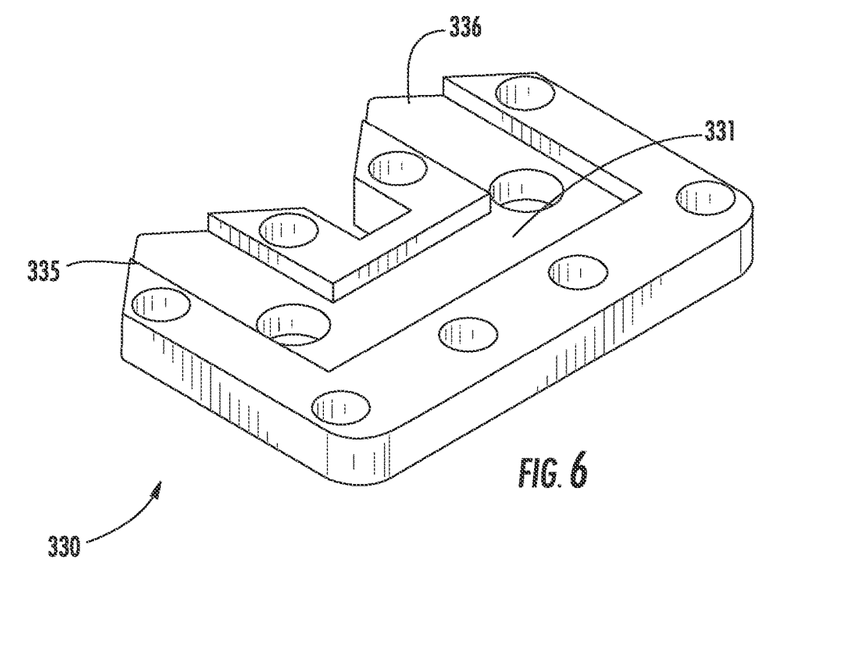
FIG. 6 is a connector used in the connecting system according to another embodiment.

While FIGS. 3A-3B describe an embodiment where the connector 230 has a first slotted portion 231 on the first surface and a second slotted portion 232 on the second surface, other embodiments are also possible. For example, FIG. 6 shows a connector 330 according to a second embodiment. In this embodiment, the connector 330 may include a first port 335 and a second port 336. A deep slotted portion 331 may be disposed in the first, or top surface, of the connector 330. Unlike the first slotted portion 231 and second slotted portion 232 of connector 230, the deep slotted portion 331 is sized to accommodate two superconducting tapes 240. Further, the second, or bottom surface, of connector 330 may not have a recessed portion.

Figure 7:
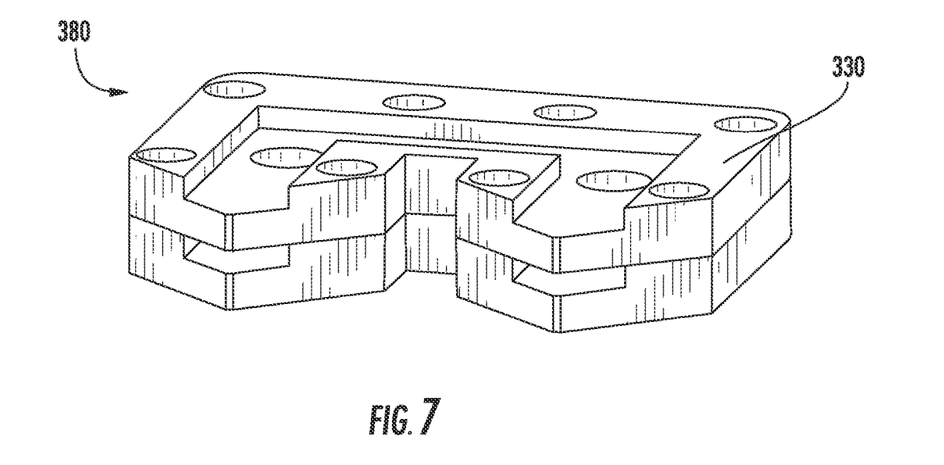
FIG. 7 is a connector stack using the connector of FIG. 6.

Thus, as shown in FIG. 7, when a plurality of connectors 330 are placed in a stack 380, each connector 330 (except the topmost connector) provides an opportunity to accommodate two superconducting tapes 240 arranged in a paired configuration. Therefore, like the configuration using the connector of FIGS. 3A-3B, to accommodate N superconducting tapes 240, a total of (N/2)+1 connectors 330 are employed.

The two superconducting tapes 240 arranged in paired configuration may each be disposed in a protective sleeve 290, as shown in FIG. 5A. In another embodiment, only one of the superconducting tapes 240 is disposed in a protective sleeve 290, as shown in FIG. 5B. As described above, the non-superconducting second sides of the two superconducting tapes 240 may be disposed adjacent to each other The connector 230 of FIGS. 3A-3B and the connector 330 of FIG. 6, when assembled into a connector stack, each provide a plurality of openings, where each opening is sized to accommodate two superconducting tapes 240 in a paired configuration. In the embodiment of FIGS. 3A-3B, this opening is the combination of a first slotted portion 231 on one connector 230 and a second slotted portion 232 on a second connector 230. In the embodiment of FIG. 6, this opening is the deep slotted portion 331 disposed on the first surface of connector 330. The two superconducting tapes 240 may be arranged so that the non-superconducting second sides of the two tapes are adjacent to one another. Further, as described above, one or both of the two superconducting tapes 240 may be disposed in a protective sleeve 290.

Further, each opening is a cavity into which two superconducting tapes 240 are inserted. Each cavity has an upper cavity surface and a lower cavity surface. The upper cavity surface of each opening is the second or bottom surface of a first connector, while the bottom cavity surface is the first or top surface of a second connector, which is disposed beneath the first connector. The first superconducting sides of the two superconducting tapes 240 are each disposed against a respective one of these two cavity surfaces. In other words, the superconducting side of each superconducting tape 240 is in physical contact with a surface of a connector in the connector stack. In certain embodiments, the protective sleeve 290 does not extend into the cavity.

The embodiments described above in the present application may have many advantages. First, the number of connectors used to support a given number of parallel superconducting tapes may be reduced by almost 50%. This may represent a significant cost savings.

Secondly, as described above, to support a parallel configuration of superconducting tapes 240, the connectors are typically disposed in a connector stack, with one connector disposed on top of another. By reducing the number of connectors used to support a given number of parallel superconducting tapes, the height of the connector stack can be reduced. In one embodiment, this may allow the volume of the enclosure used to house the superconducting array to be reduced. This saves physical space. A smaller enclosure is also filled by a reduced amount of coolant. In another embodiment, the reduction in the height of the connector stack may allow the superconducting arrays within the SCFCL system to be placed closer together than would otherwise be possible. This, in turn, allows increased specifications, in terms of operating voltage and maximum operating current in a given volume.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A superconducting fault current limiter (SCFCL) system, comprising:
   a tank;
   coolant contained in the tank;
   a connector stack immersed in the coolant, the connector stack comprising a plurality of connectors disposed one on top of another, and having one or more openings, each opening adapted to hold two superconducting tapes; and
   two superconducting tapes, in a paired configuration, disposed in a respective one of the one or more openings.

2. The SCFCL system of claim 1, where each connector in the connector stack has a first surface and a second surface, opposite the first surface, such that the first surface of a first connector in the connector stack is disposed on the second surface of a second connector, and wherein each first surface comprises a first recessed portion and each second surface comprises a second recessed portion, wherein the first recessed portion of the first connector is aligned with the second recessed portion of the second connector, and together form one of the one or more openings.

3. The SCFCL system of claim 1, where each connector in the connector stack has a first surface and a second surface, opposite the first surface, such that the first surface of a first connector in the connector stack is disposed on the second surface of a second connector, and wherein each first surface comprises a deep recessed portion, which forms one of the one or more openings.

4. The SCFCL system of claim 1, wherein a first side of each superconducting tape is superconducting and a second side, opposite the first side, is non-superconducting, and wherein the second side of the two superconducting tapes in a paired configuration are adjacent to one another.

5. The SCFCL system of claim 4, wherein the first side of each of the two superconducting tapes is in physical contact with a surface of a connector in the connector stack.

6. The SCFCL system of claim 1, wherein at least one of the two superconducting tapes is disposed in a protective sleeve.

7. The SCFCL system of claim 6, wherein the protective sleeve does not extend into the opening.

8. A connecting system for use with superconducting tape, comprising:
   a connector stack immersed in a coolant, the connector stack comprising a plurality of connectors disposed one on top of another, and having one or more openings, each adapted to hold two superconducting tapes; and
   two superconducting tapes, in a paired configuration, disposed in a respective one of the one or more openings.

9. The connecting system of claim 8, wherein at least one of the two superconducting tapes is disposed in a protective sleeve.

10. The connecting system of claim 9, wherein the protective sleeve does not extend into the one or more openings.

11. The connecting system of claim 8, wherein both of the two superconducting tapes are disposed in a protective sleeve.

12. The connecting system of claim 8, wherein a first side of each superconducting tape is superconducting and a second side, opposite the first side, is non-superconducting, and wherein the second side of the two superconducting tapes in a paired configuration are adjacent to one another.

13. A superconducting fault current limiter (SCFCL) system, comprising:
   a tank;
   coolant contained in the tank; and
   a superconducting array immersed in the coolant, the superconducting array comprising:
      a substrate having a first end and a second end;
      a first connector stack disposed at the first end, comprising a plurality of connectors disposed one on top of another, and having one or more first openings, each first opening adapted to hold two superconducting tapes;
      a second connector stack disposed at the second end, comprising a plurality of connectors disposed one on top of another, and having one or more second openings, each second opening adapted to hold two superconducting tapes; and
      two superconducting tapes, in a paired configuration, each having a first end and a second end, wherein the first end of the two superconducting tapes is disposed in one of the one or more first openings and the second end of the two superconducting tapes is disposed in one of the one or more second openings.

14. The SCFCL system of claim 13, where each connector in the first connector stack has a first surface and a second surface, opposite the first surface, such that the first surface of a first connector in the first connector stack is disposed on the second surface of a second connector, and wherein each first surface comprises a first recessed portion and each second surface comprises a second recessed portion, wherein the first recessed portion of the first connector is aligned with the second recessed portion of the second connector, and together form one of the one or more first openings.

15. The SCFCL system of claim 13, where each connector in the first connector stack has a first surface and a second surface, opposite the first surface, such that the first surface of a first connector in the first connector stack is disposed on the second surface of a second connector, and wherein each first surface comprises a deep recessed portion, which forms one of the one or more first openings.

16. The SCFCL system of claim 13, wherein a first side of each of the two superconducting tapes is superconducting and a second side, opposite the first side, is non-superconducting, and wherein the second side of the two superconducting tapes are adjacent to one another.

17. The SCFCL system of claim 16, wherein the first side of the first end of each of the two superconducting tapes is in physical contact with a surface of a connector in the first connector stack.

18. The SCFCL system of claim 13, wherein at least one of the two superconducting tapes is disposed in a protective sleeve.

19. The SCFCL system of claim 13, wherein both of the two superconducting tapes are disposed in a protective sleeve.

20. The SCFCL system of claim 18, wherein the protective sleeve does not extend into the one or more first openings or the one or more second openings.

* * * * *